(12) United States Patent
Kim et al.

(10) Patent No.: US 12,331,399 B2
(45) Date of Patent: Jun. 17, 2025

(54) APPARATUS FOR SMOOTHLY EXHAUSTING THE ATMOSPHERE IN A PROCESSING SPACE WHEN ROTATING A SUBSTRATE WITH LIQUID

(71) Applicant: SEMES CO., LTD., Chungcheongnam-do (KR)

(72) Inventors: Ju Won Kim, Chungcheongnam-do (KR); Yang Yeol Ryu, Chungcheongnam-do (KR); Hee Man Ahn, Seoul (KR); Jun Ho Seo, Seoul (KR); Dong Woon Park, Seoul (KR); Sang Pil Yoon, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 2 days.

(21) Appl. No.: 17/564,285

(22) Filed: Dec. 29, 2021

(65) Prior Publication Data
US 2022/0205090 A1    Jun. 30, 2022

(30) Foreign Application Priority Data

Dec. 30, 2020 (KR) .......................... 10-2020-0188422

(51) Int. Cl.
*C23C 16/44* (2006.01)
*B05B 14/44* (2018.01)
(Continued)

(52) U.S. Cl.
CPC .......... *C23C 16/4412* (2013.01); *B05B 14/44* (2018.02); *B60H 1/00564* (2013.01);
(Continued)

(58) Field of Classification Search
CPC ........ F01N 13/08; F01N 13/10; F01N 13/107; F16L 41/03; F16L 39/00
(Continued)

(56) References Cited

U.S. PATENT DOCUMENTS 1,542,178 A * 6/1925 Ross ..................... F24F 7/08
454/251
1,578,950 A * 3/1926 Bartling ................. B05B 14/44
118/DIG. 7
(Continued)

FOREIGN PATENT DOCUMENTS

JP           2005327761 A    11/2005
KR       1020170056990 A     5/2017
(Continued)

OTHER PUBLICATIONS

Notice of Allowance issued by the Korean Intellectual Property Office on Nov. 28, 2022 in corresponding KR Patent Application No. 10-2020-0188422, with English Translation.
(Continued)

*Primary Examiner* — Karl Kurple
(74) *Attorney, Agent, or Firm* — Carter, DeLuca & Farrell LLP

(57) ABSTRACT

An apparatus for processing a substrate includes a first processing unit configured to have a first processing container having a first inner space and a first support unit supporting and rotating the substrate in the first inner space; a second processing unit configured to have a second processing container having a second inner space and a second support unit supporting and rotating the substrate in the second inner space; an exhaust unit configured to exhaust the first and the second inner space; a first exhaust pipe configured to have a first exhaust port for introducing atmosphere of the first inner space and exhaust the atmosphere introduced through the first exhaust port to the integrated duct; and a second exhaust pipe configured to have a second exhaust port for introducing atmosphere of the second inner space and exhaust the atmosphere introduced through the second exhaust port to the integrated duct.

16 Claims, 11 Drawing Sheets

(51) Int. Cl.
    *B60H 1/00*     (2006.01)
    *F24F 7/08*     (2006.01)
    *F24F 13/072*     (2006.01)
    *H01L 21/67*     (2006.01)
    *H01L 21/687*     (2006.01)

(52) U.S. Cl.
    CPC .............. *F24F 7/08* (2013.01); *F24F 13/072* (2013.01); *H01L 21/67051* (2013.01); *H01L 21/6715* (2013.01); *H01L 21/67161* (2013.01); *H01L 21/68764* (2013.01)

(58) Field of Classification Search
    USPC ................................................. 138/111–117
    See application file for complete search history.

(56) References Cited

U.S. PATENT DOCUMENTS

| | | | | |
|---|---|---|---|---|
| 2,937,589 | A | * | 5/1960 | Rachlin ................. F24F 13/072 454/297 |
| 3,270,655 | A | * | 9/1966 | Guirl ..................... F24F 13/072 454/192 |
| 3,880,060 | A | * | 4/1975 | Herb ..................... F24F 13/072 454/301 |
| 6,426,303 | B1 | | 7/2002 | Ueda |
| 2011/0308631 | A1 | * | 12/2011 | Bahrton .................. F16K 17/34 137/561 R |
| 2019/0329797 | A1 | * | 10/2019 | Davis ................. B60H 1/00371 |

FOREIGN PATENT DOCUMENTS

| | | |
|---|---|---|
| KR | 10-2019-0014254 A | 2/2019 |
| KR | 10-2019-0022997 A | 3/2019 |
| KR | 10-2019-0096901 A | 8/2019 |
| KR | 10-2020-0075162 A | 6/2020 |
| KR | 10-2020-0143537 A | 12/2020 |
| KR | 10-2020-0143538 A | 12/2020 |

OTHER PUBLICATIONS

Chinese Office Action issued by the China National Intellectual Property Administration on Jan. 23, 2025 in corresponding CN Patent Application No. 202111651064.4, with English translation.

* cited by examiner

-- Prior Art --

-- Prior Art --

-- Prior Art --

APPARATUS FOR SMOOTHLY EXHAUSTING THE ATMOSPHERE IN A PROCESSING SPACE WHEN ROTATING A SUBSTRATE WITH LIQUID

CROSS-REFERENCE TO RELATED APPLICATIONS

This application claims priority to and the benefit of the Korean Patent Application No. 10-2020-0188422 filed in the Korean Intellectual Property Office on Dec. 30, 2020, the entire contents of which are incorporated herein by reference.

TECHNICAL FIELD

The present invention relates to an apparatus for processing a substrate and more particularly, to an apparatus for processing a substrate by supplying a liquid to a rotating substrate.

BACKGROUND ART

In order to manufacture semiconductor devices, various processes such as cleaning, deposition, photolithography, etching, and ion-implantation are performed. Among these processes, the photolithography process includes a coating process of coating a photosensitive liquid such as a photoresist on the surface of a substrate to form a film, an exposure process of transferring a circuit pattern to the film formed on the substrate, and a developing process of removing the film formed on the substrate selectively from an exposed region or an opposite region thereto.

A substrate processing apparatus used in the coating process of coating the photosensitive liquid such as the photoresist to form the film includes a cup-shaped processing container having a processing space, a support unit supporting and rotating a substrate W in the processing space, and a nozzle supplying the photoresist onto the substrate placed on the support unit.

An exhaust unit is coupled to a bottom wall of the processing container to exhaust the atmosphere of the processing space. Generally, the exhaust unit includes an integrated duct that connects a plurality of exhaust pipes connected to a plurality of processing containers, respectively, and the plurality of processing spaces are exhausted simultaneously through the integrated duct. An exhaust pump is provided in the integrated duct.

In this case, an exhaust amount through an exhaust duct connected close to the exhaust pump connected with the integrated duct and an exhaust amount through an exhaust duct connected far away with the exhaust pump are different from each other to generate a difference in exhaust amount, which has an effect on uniformity of the thickness of a coating film of the photoresist between the regions of the substrate. In addition, the atmosphere is not exhausted at a predetermined flow rate from the processing space of the processing container connected with the close or far-connected exhaust duct.

SUMMARY OF THE INVENTION

An object of the present invention is to provide an apparatus for processing a substrate capable of improving the substrate processing efficiency.

An object of the present invention is to provide an apparatus for processing a substrate capable of smoothly exhausting the atmosphere in a processing space when processing the substrate by supplying a processing liquid to a rotating substrate in an inner space.

An object of the present invention is to provide an apparatus for processing a substrate capable of uniformly providing the thickness of a liquid film on a plurality of substrates provided to a plurality of processing spaces when forming the liquid film on the substrate by supplying a processing liquid to the rotating substrate.

Other objects of the present invention are not limited to the objects described above, and other objects, which are not mentioned above, will be apparent to those skilled in the art from the following description.

An exemplary embodiment of the present invention provides an apparatus for processing a substrate. According to an exemplary embodiment, the apparatus for processing a substrate includes a first processing unit configured to have a first processing container having a first inner space therein and a first support unit supporting and rotating the substrate in the first inner space and to process the substrate; a second processing unit configured to have a second processing container having a second inner space therein and a second support unit supporting and rotating the substrate in the second inner space and to process the substrate; and an exhaust unit configured to exhaust the first inner space and the second inner space, wherein the first processing unit and the second processing unit are arranged in a line, wherein the exhaust unit comprises an integrated duct having a portion positioned in a Y axial direction when the unit arrangement direction is in an X axis, wherein a longitudinal direction of the integrated duct is substantially parallel with the unit arrangement direction; a first exhaust pipe configured to have a first exhaust port for introducing the atmosphere of the first inner space and exhaust the atmosphere introduced through the first exhaust port to the integrated duct; and a second exhaust pipe configured to have a second exhaust port for introducing the atmosphere of the second inner space and exhaust the atmosphere introduced through the second exhaust port to the integrated duct, wherein the integrated duct comprises a first wall member configured to partition an exhaust path in the integrated duct, and wherein the first wall member starts between a first position where the first exhaust pipe is connected with the integrated duct and a second position where the second exhaust pipe is connected with the integrated duct and extend along the exhaust direction of the exhaust path and partition a first exhaust path provided to be circulating with the first exhaust pipe and a second exhaust path provided to be circulating with the second exhaust pipe.

In the exemplary embodiment, the first wall member may extend to the downstream according to the exhaust direction of the first position.

In the exemplary embodiment, at the end of the first wall member, the cross-sectional areas of the first exhaust path and the second exhaust path may be equally provided.

In the exemplary embodiment, the apparatus may further include a third processing unit configured to have a third processing container having a third inner space therein and a third support unit supporting and rotating the substrate in the third inner space and to process the substrate, wherein the third processing unit is arranged in a line with the first processing unit and the second processing unit, wherein the exhaust unit further comprises a third exhaust pipe configured to further exhaust the third inner space, have a third exhaust port for introducing the atmosphere of the third inner space, and exhaust the atmosphere introduced through the third exhaust port to the integrated duct, wherein the integrated duct further comprises a second wall member configured to partition the exhaust path in the integrated duct, and wherein the second wall member starts between the second position and a third position where the second exhaust pipe is connected with the integrated duct and extend along the exhaust direction of the exhaust path and partition a third exhaust path provided to be circulating with the second exhaust pipe and the third exhaust pipe.

In the exemplary embodiment, the first wall member and the second wall member may extend to the downstream according to the exhaust direction of the first position.

In the exemplary embodiment, at the ends of the first wall member and the second wall member, the cross-sectional areas of the first exhaust path, the second exhaust path, and the third exhaust path may be equally provided.

In the exemplary embodiment, the first exhaust pipe may be coupled to a bottom wall of the first processing container, and the second exhaust pipe may be coupled to a bottom wall of the second processing container.

In the exemplary embodiment, the apparatus may further include a liquid supply unit configured to supply a processing liquid onto the substrate supported by the first support unit or the second support unit.

In the exemplary embodiment, a decompression member may be provided downstream the first position of the integrated duct.

In the exemplary embodiment, the apparatus may further include a liquid supply unit configured to eject the processing liquid to the substrate, wherein the liquid supply unit may include nozzles; and a nozzle driver configured to move the nozzles to a first process position facing the first support unit or a second process position facing the second support unit so that the nozzles eject the liquid to a substrate selected from the substrate supported by the first support unit and the substrate supported by the second support unit.

In the exemplary embodiment, the processing liquid may be a photoresist.

In the exemplary embodiment, the apparatus may further include a first fan filter unit located above the first processing unit and configured to include a fan for introducing external air to the first inner space and a filter for filtering the external air; and a second fan filter unit located above the second processing unit and configured to include a fan for introducing external air to the second inner space and a filter for filtering the external air.

In the exemplary embodiment, the first exhaust pipe and the second exhaust pipe may be sequentially arranged along the arrangement direction of the first processing unit and the second processing unit.

In the exemplary embodiment, the first exhaust pipe, the second exhaust pipe, and the third exhaust pipe may be sequentially arranged along the arrangement direction of the first processing unit, the second processing unit, and the third processing unit.

An exemplary embodiment of the present invention provides an apparatus for processing a substrate. The apparatus may include a first processing unit configured to have a first processing container having a first inner space therein and a first support unit supporting and rotating the substrate in the first inner space and to process the substrate; a second processing unit configured to have a second processing container having a second inner space therein and a second support unit supporting and rotating the substrate in the second inner space and to process the substrate; a third processing unit configured to have a third processing container having a third inner space therein and a third support unit supporting and rotating the substrate in the third inner space and to process the substrate; and an exhaust unit configured to exhaust the first inner space, the second inner space, and the third inner space, wherein the first processing unit, the second processing unit, and the third processing unit are arranged in a line, wherein the exhaust unit comprises an integrated duct which is located on one side of a unit arrangement direction based on the unit arrangement direction in which the first processing unit, the second processing unit, and the third processing unit are arranged; a first exhaust pipe coupled to a bottom wall of the first processing container and configured to have a first exhaust port for introducing the atmosphere of the first inner space and exhaust the atmosphere introduced through the first exhaust port to the integrated duct; a second exhaust pipe coupled to a bottom wall of the second processing container and configured to have a second exhaust port for introducing the atmosphere of the second inner space and exhaust the atmosphere introduced through the second exhaust port to the integrated duct; and a third exhaust pipe coupled to a bottom wall of the third processing container and configured to have a third exhaust port for introducing the atmosphere of the third inner space and exhaust the atmosphere introduced through the third exhaust port to the integrated duct, wherein the integrated duct comprises a first wall member and a second wall member configured to partition an exhaust path in the integrated duct, wherein the first wall member starts between a first position where the first exhaust pipe is connected with the integrated duct and a second position where the second exhaust pipe is connected with the integrated duct and extend along the exhaust direction of the exhaust path and partition a first exhaust path provided to be circulating with the first exhaust pipe and a second exhaust path provided to be circulating with the second exhaust pipe, wherein the second wall member starts between the second position and a third position where the second exhaust pipe is connected with the integrated duct and extend along the exhaust direction of the exhaust path and partition a third exhaust path provided to be circulating with the second exhaust pipe and the third exhaust pipe, and wherein the first wall member and the second wall member extend to the downstream according to the exhaust direction of the first position.

In the exemplary embodiment, at the ends of the first wall member and the second wall member, the cross-sectional areas of the first exhaust path, the second exhaust path, and the third exhaust path may be equally provided.

In the exemplary embodiment, the apparatus may further include a liquid supply unit configured to eject the processing liquid to the substrate, wherein the liquid supply unit may include nozzles; and a nozzle driver configured to move the nozzles to a first process position facing the first support unit, a second process position facing the second support unit, or a third process position facing the third support unit so that the nozzles eject the liquid to a substrate selected from the substrate supported by the first support unit, the substrate supported by the second support unit, and the substrate supported by the third support unit.

In the exemplary embodiment, the processing liquid may be a photoresist.

In the exemplary embodiment, the apparatus may further include a first fan filter unit located on the first processing unit and configured to include a fan for introducing external air to the first inner space and a filter for filtering the external air; a second fan filter unit located on the second processing unit and configured to include a fan for introducing external air to the second inner space and a filter for filtering the external air; and a third fan filter unit located on the third processing unit and configured to include a fan for introducing external air to the third inner space and a filter for filtering the external air.

In the exemplary embodiment, the first exhaust pipe, the second exhaust pipe, and the third exhaust pipe may be sequentially arranged along the arrangement direction of the first processing unit, the second processing unit, and the third processing unit.

According to the exemplary embodiment of the present invention, it is possible to improve the substrate processing efficiency.

According to the exemplary embodiment of the present invention, it is possible to smoothly exhaust the atmosphere in a processing space when processing a substrate by supplying a processing liquid to the rotating substrate in the inner space.

According to the exemplary embodiment of the present invention, it is possible to uniformly provide the thickness of a liquid film on a plurality of substrates provided to a plurality of processing spaces when forming the liquid film on the substrate by supplying a processing liquid to the rotating substrate.

The effect of the present invention is not limited to the foregoing effects, and non-mentioned effects will be clearly understood by those skilled in the art from the present specification and the accompanying drawings.

DETAILED DESCRIPTION

Figure 1:
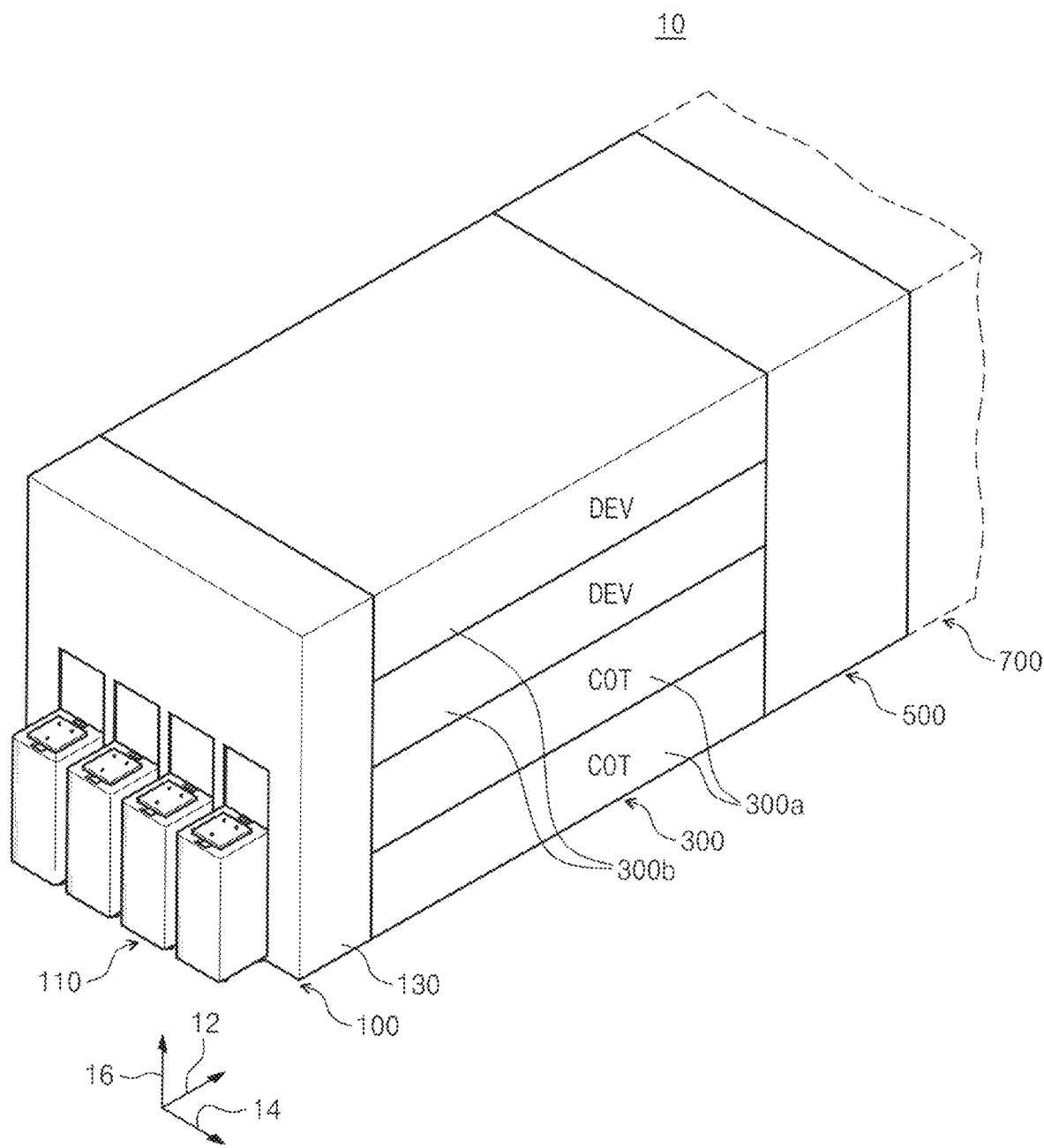
FIG. 1 is a perspective view schematically illustrating a substrate processing apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. In the present application, it should be understood that term "including" or "having" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only for distinguishing one component from the other component. For example, a first component may be named as a second component and similarly, the second component may also be named as the first component without departing from the scope of the present invention.

It should be understood that, when it is described that a component is "connected to" or "accesses" another component, the component may be directly connected to or access the other component or a third component may be present therebetween. In contrast, it should be understood that, when it is described that a component is "directly connected to" or "directly access" or "contact" another element, no component is present between the component and another component. Meanwhile, other expressions describing the relationship of the components, that is, expressions such as "between" and "directly between" or "adjacent to" and "directly adjacent to" should be similarly interpreted.

If it is not contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

An apparatus of the exemplary embodiment may be used to perform a photolithography process with respect to a circular substrate. In particular, the apparatus of the exemplary embodiment is connected to an exposure apparatus and may be used to perform a coating process of coating a photoresist on the substrate. However, the technical idea of the present invention is not limited thereto, and the supplying of other processing liquids in addition to the photoresist to the rotating substrate may be applied to various types of processes. For example, the processing liquid may be a developing solution, a chemical, a rinse liquid, an organic solvent, and the like. In addition, the technical idea of the present invention may be applied even to a process in which the substrate is rotated while exhausting a space provided with the substrate without supplying the processing liquid.

Hereinafter, an exemplary embodiment of the present invention will be described with reference to FIGS. 1 to 12.

Figure 2:
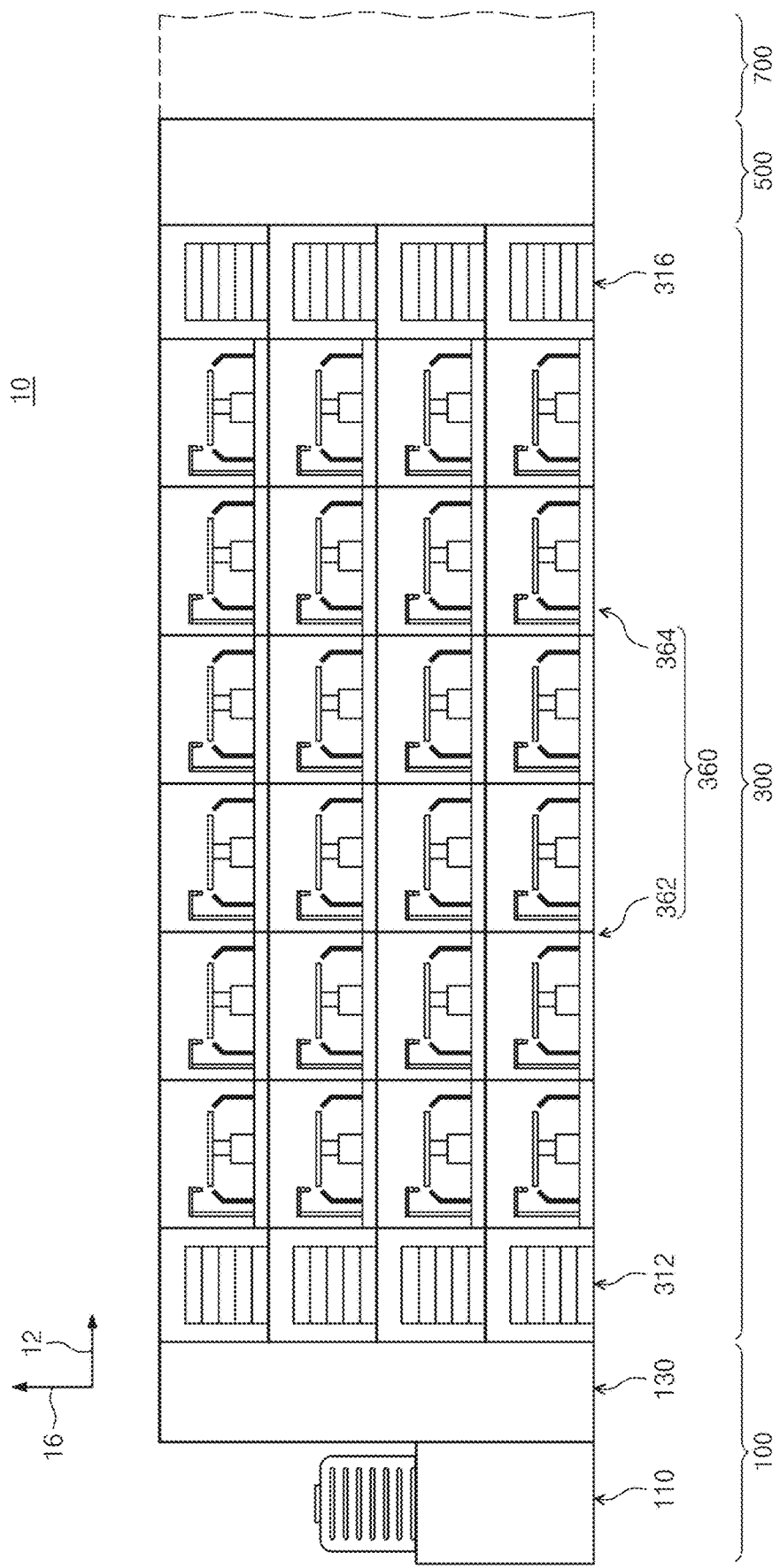
FIG. 2 is a cross-sectional view of the substrate processing apparatus illustrating a coating block or a developing block of FIG. 1.
Figure 3:
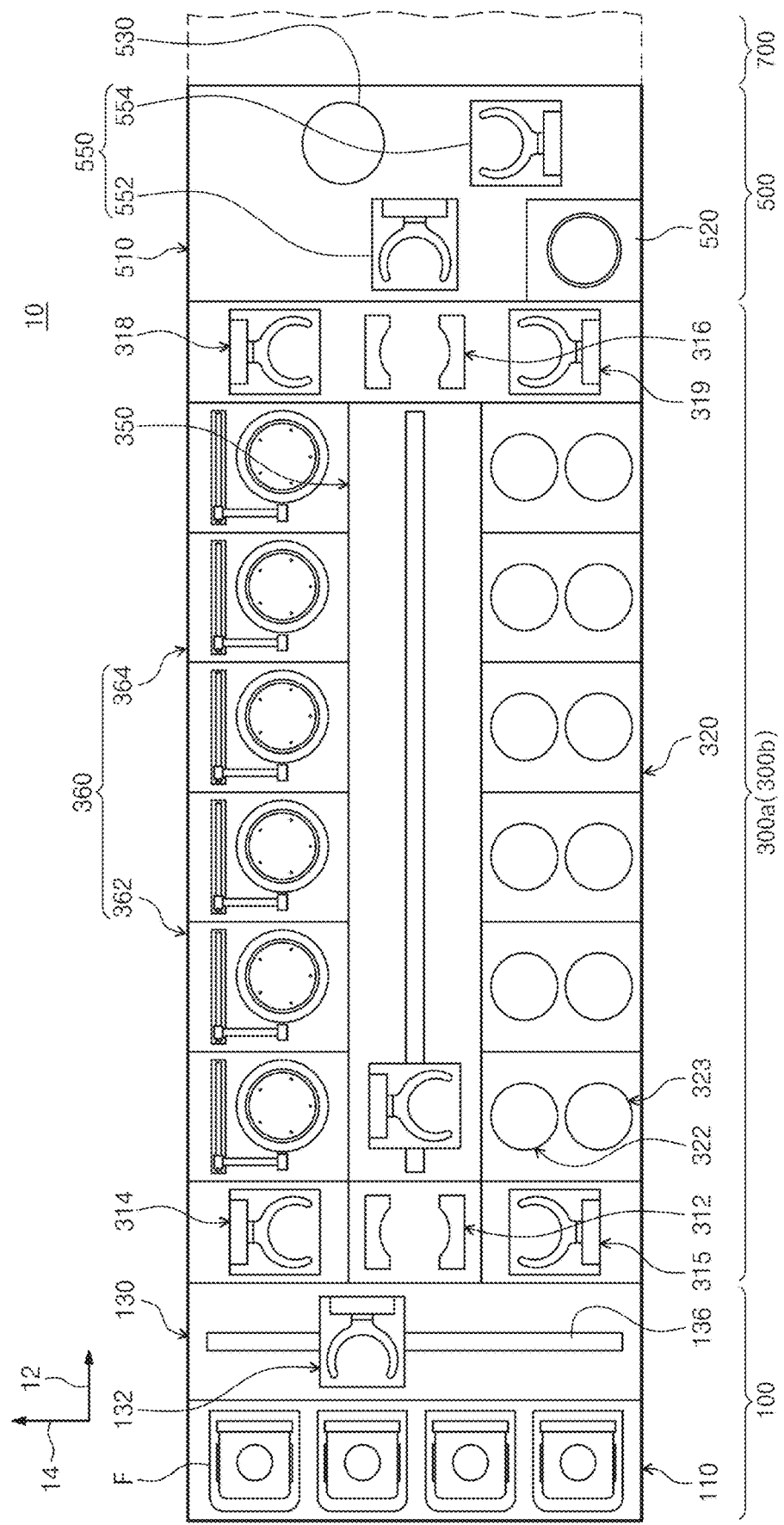
FIG. 3 is a plan view of the substrate processing apparatus of FIG. 1.

FIG. 1 is a perspective view schematically illustrating a substrate processing apparatus according to an exemplary embodiment of the present invention, FIG. 2 is a cross-sectional view of the substrate processing apparatus illustrating a coating block or a developing block of FIG. 1, and FIG. 3 is a plan view of the substrate processing apparatus of FIG. 1.

Referring to FIGS. 1 to 3, a substrate processing apparatus 10 according to the exemplary embodiment of the present invention includes an index module 100, a processing module 300, and an interface module 500. According to the exemplary embodiment, the index module 100, the processing module 300, and the interface module 500 are sequentially arranged in a line. Hereinafter, a direction in which the index module 100, the processing module 300, and the interface module 500 are arranged is defined as a first direction 12, a direction vertical to the first direction 12 when viewed from the top is defined as a second direction 14, and a direction vertical to both the first direction 12 and the second direction 14 is defined as a third direction 16.

The index module 100 conveys a substrate W to the processing module 300 from a container F in which the substrate W is received and receives the processed substrate W in the container F. The longitudinal direction of the index module 100 is provided as the second direction 14. The index module 100 has a load port 110 and an index frame 130. The load port 110 is located on an opposite side of the processing module 300 based on the index frame 130. The container F in which the substrates W are received is placed on the load port 110. A plurality of load ports 110 may be provided, and the plurality of load ports 110 may be disposed along the second direction 14.

As the container F, a closed container F such as a front open unified pod (FOUP) may be used. The container F may be placed on a conveying means (not illustrated) such as an overhead transfer, an overhead conveyor, or an automatic guided vehicle or the load port 110 by an operator.

An index robot 132 is provided inside the index frame 130. In the index frame 130, a guide rail 136 in which the longitudinal direction is provided as the second direction 14 is provided, and the index robot 132 may be provided to be movable on the guide rail 136. The index robot 132 includes a hand on which the substrate W is placed, and the hand may be provided to move forward and backward, rotate on an axis of the third direction 16, and be movable along the third direction 16.

The processing module 300 may perform a coating process and a developing process for the substrate W. The processing module 300 may receive the substrate W received in the container F to perform a substrate processing process. The processing module 300 has a coating block 300a and a developing block 300b. The coating block 300a performs the coating process for the substrate W, and the developing block 300b performs the developing process for the substrate W. A plurality of coating blocks 300a are provided and stacked with each other. A plurality of developing blocks 300b are provided and stacked with each other. According to the exemplary embodiment of FIG. 1, two coating blocks 300a and two developing blocks 300b are provided. The coating blocks 300a may be disposed below the developing blocks 300b. According to an exemplary embodiment, the two coating blocks 300a may perform the same process as each other, and may be provided in the same structure as each other. In addition, the two developing blocks 300b may perform the same process as each other, and may be provided in the same structure as each other.

Referring to FIG. 3, the coating block 300a has a heat processing chamber 320, a conveying chamber 350, a liquid processing chamber 360, and buffer chambers 312 and 316. The heat processing chamber 320 performs a heat processing process for the substrate W. The heat processing process may include a cooling process and a heating process. The liquid processing chamber 360 supplies a liquid onto the substrate W to form a liquid film. The liquid film may be a photoresist film or an anti-reflection layer. The conveying chamber 350 conveys the substrate W between the heat processing chamber 320 and the liquid processing chamber 360 in the coating block 300a.

The conveying chamber 350 is provided with a longitudinal direction in parallel with the first direction 12. The conveying chamber 350 is provided with a conveying robot 352. The conveying robot 352 conveys the substrate between the heat processing chamber 320, the liquid processing chamber 360, and the buffer chambers 312 and 316. According to the exemplary embodiment, the conveying robot 352 has a hand on which the substrate W is placed, and the hand may be provided to move forward and backward, rotate on an axis of the third direction 16, and be movable along the third direction 16. In the conveying chamber 350, a guide rail 356 of which the longitudinal direction is provided in parallel with the first direction 12 is provided, and the conveying robot 352 may be provided to be movable on the guide rail 356.

Figure 4:
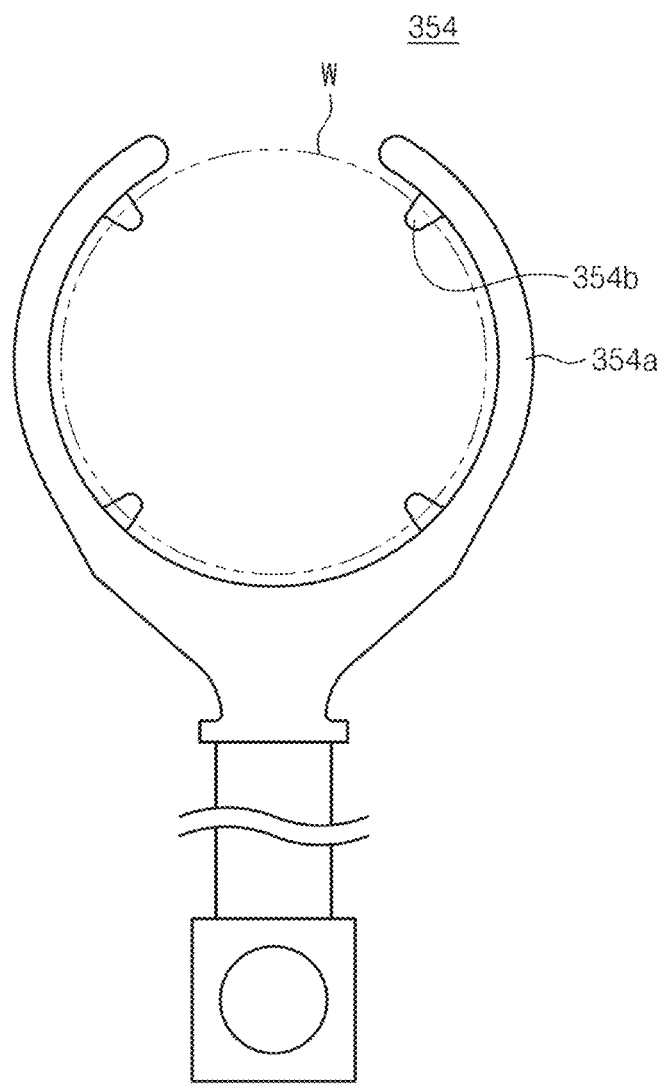
FIG. 4 is a plan view schematically illustrating a conveying robot of FIG. 3.

FIG. 4 is a diagram illustrating an example of a handle 354 of the conveying robot 352. Referring to FIG. 4, the hand 354 has a base 354a and a support protrusion 354b. The base 354a may have an annular ring shape in which a part of the circumference is bent. The base 354a has an inner diameter greater than the diameter of the substrate W. The support protrusion 354b extends to the inner side thereof from the base 354a. A plurality of support protrusions 354b is provided, and supports an edge region of the substrate W. According to the exemplary embodiment, four support protrusions 354b may be provided at equal intervals.

A plurality of heat processing chambers 320 is provided. The heat processing chambers 320 are disposed along the first direction 12. The heat processing chambers 320 are located on one side of the conveying chamber 350.

Figure 5:
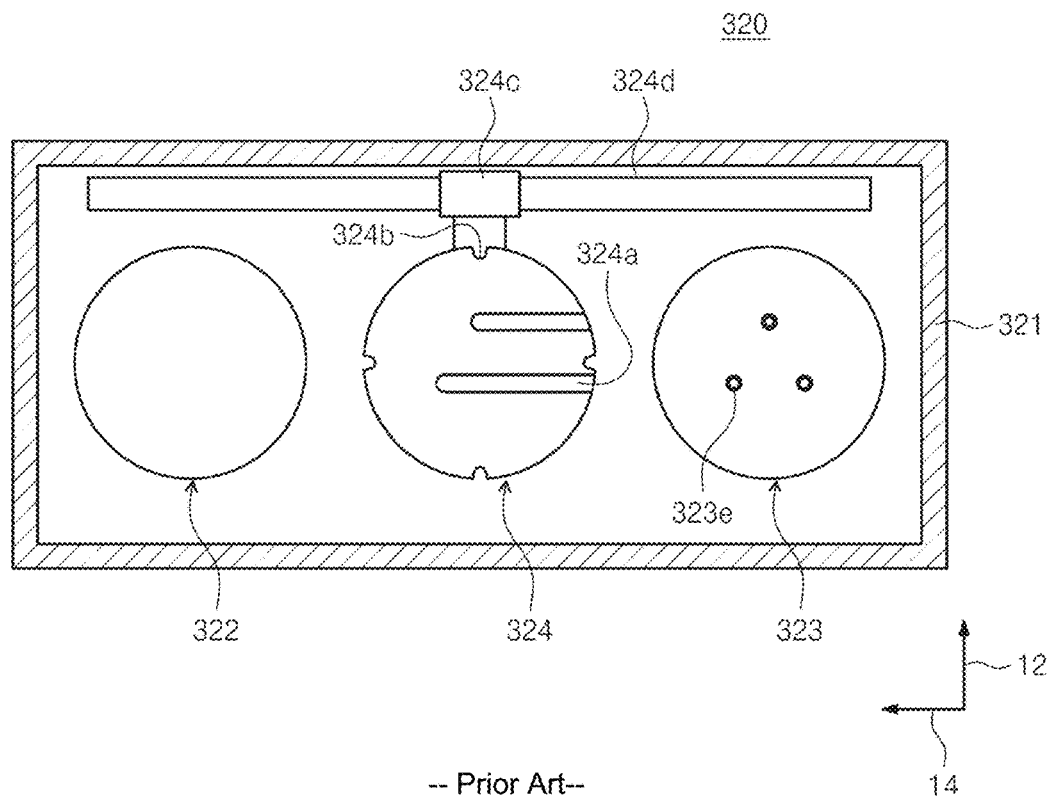
FIG. 5 is a plan view schematically illustrating an example of a heat processing chamber of FIG. 3.
Figure 6:
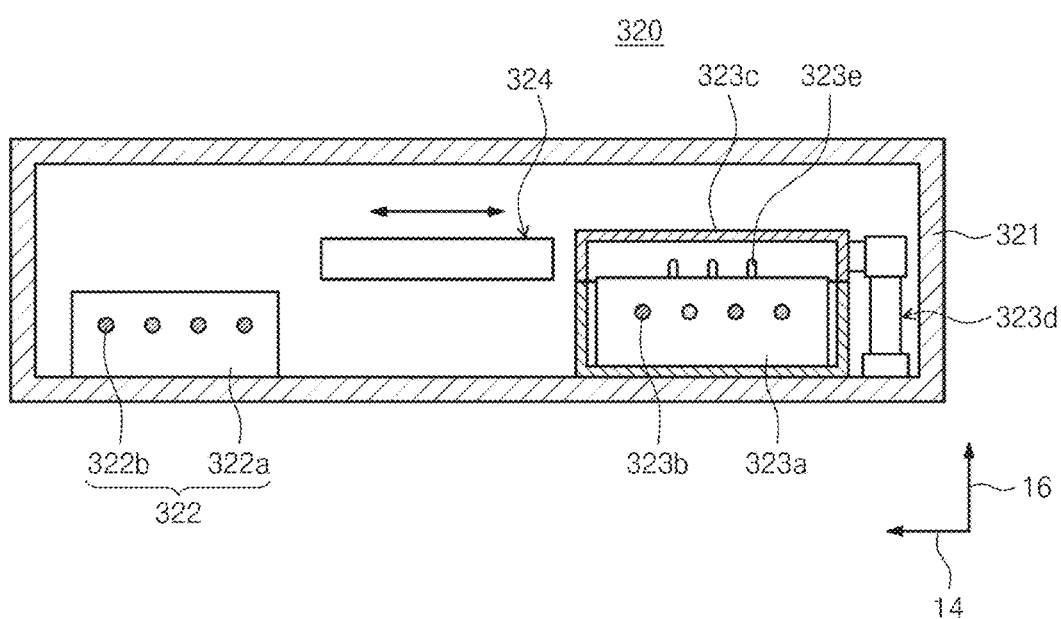
FIG. 6 is a front view of the heat processing chamber of FIG. 3.

FIG. 5 is a plan view schematically illustrating an example of the heat processing chamber of FIG. 4 and FIG. 6 is a front view of the heat processing chamber of FIG. 5.

Referring to FIGS. 5 and 6, the heat processing chamber 320 has a housing 321, a cooling unit 322, a heating unit 323, and a conveying plate 324.

The housing 321 is provided in a substantially cuboid shape. On a side wall of the housing 321, a carrying port (not illustrated) through which the substrate W is carried in or out is formed. The carrying port may be kept in an open state. Optionally, a door (not illustrated) may be provided to open and close the carrying port. The cooling unit 322, the heating unit 323, and the conveying plate 324 are provided in the housing 321. The cooling unit 322 and the heating unit 323 are arranged along the second direction 14. According to the exemplary embodiment, the cooling unit 322 may be positioned closer to the conveying chamber 350 than the heating unit 323.

The cooling unit 322 has a cooling plate 322a. The cooling plate 322a may have a substantially circular shape when viewed from the top. The cooling plate 322a is provided with a cooling member 322b. According to the exemplary embodiment, the cooling member 322b is formed inside the cooling plate 322a, and may be provided as a flow channel in which the cooling fluid flows.

The heating unit 323 has a heating plate 323a, a cover 323c, and a heater 323b. The heating plate 323a has a substantially circular shape when viewed from the top. The heating plate 323a has a diameter greater than the substrate W. The heating plate 323a is provided with a heater 323b. The heater 323b may be provided as a heating resistor to which a current is applied. The heating plate 323a is provided with lift pins 323e that can be driven in a vertical direction along the third direction 16. The lift pins 323e receives the substrate W from a conveying means outside the heating unit 323 to put down the substrate W on the heating plate 323a or lifts the substrate W from the heating plate 323a to transfer the substrate W to the conveying means outside the heating unit 323. According to the exemplary embodiment, three lift pins 323e may be provided. The cover 323c has a space with an opened lower portion therein.

The cover 323c is positioned on the heating plate 323a and is moved in the vertical direction by a driver 3236d. The cover 323c is moved so that a space formed with the cover 323c and the heating plate 323a is provided as a heating space for heating the substrate W.

The conveying plate 324 is provided in a substantially disk shape and has a diameter corresponding to the substrate W. A notch 324b is formed at the edge of the conveying plate 324. The notch 324b may have a shape corresponding to a protrusion 3543 formed on the hand 354 of the conveying robot 352 described above. Further, the notch 324b is provided as the number corresponding to the protrusion 3543 formed on the hand 354 and is formed at a position corresponding to the protrusion 3543. When the top and bottom positions of the hand 354 and the conveying plate 324 are changed at a position where the hand 354 and the conveying plate 324 are aligned in the vertical direction, the substrate W is transferred between the hand 354 and the conveying plate 324. The conveying plate 324 is mounted on the guide rail 324d and may be moved between a first region 3212 and a second region 3214 along the guide rail 324d by the driver 324c. The conveying plate 324 is provided with a plurality of slit-shaped guide grooves 324a. The guide groove 324a extends to the inside of the conveying plate 324 from the end of the conveying plate 324. The longitudinal direction of the guide groove 324a is provided along the second direction 14, and the guide grooves 324a are located to be spaced apart from each other along the first direction 12. The guide grooves 324a prevent the conveying plate 324 and the lift pins 323e from interfering with each other when the substrate W is transferred between the conveying plate 324 and the heating unit 323.

The cooling of the substrate W is performed while the conveying plate 324 on which the substrate W is placed is in contact with the cooling plate 322a. The conveying plate 324 is provided with a material having high thermal conductivity so that the heat transfer between the cooling plate 322a and the substrate W is made well. According to the exemplary embodiment, the conveying plate 324 is provided with a metallic material.

The heating unit 323 provided to some heat processing chambers 320 of the heat processing chambers 320 may supply gas while heating the substrate W to improve the adhesion rate of the photoresist on the substrate. According to the exemplary embodiment, the gas may be hexamethyldisilane (HMDS) gas.

A plurality of liquid processing chambers 360 is provided. Some of the liquid processing chambers 360 may be provided to be stacked with each other. The liquid processing chambers 360 are disposed on one side of the conveying chamber 350. The liquid processing chambers 360 are arranged in parallel along the first direction 12. Some of the liquid processing chambers 360 are provided at a position adjacent to the index module 100. Hereinafter, the liquid processing chamber 360 located adjacent to the index module 100 is referred to as a front liquid processing chamber 362. Some of the liquid processing chambers 360 are provided at a position adjacent to the interface module 500. Hereinafter, the liquid processing chamber 360 located adjacent to the interface module 500 is referred to as a rear liquid processing chamber 364.

The front liquid processing chamber 362 coats a first liquid on the substrate W and the rear liquid processing chamber 364 coats a second liquid on the substrate W. The first liquid and the second liquid may be different kinds of liquids. According to the exemplary embodiment, the first liquid is an anti-reflection film and the second liquid is a photoresist. The photoresist may be coated on the substrate W coated with the anti-reflection film. Optionally, the first liquid may be a photoresist, and the second liquid may be an anti-reflection film. In this case, the anti-reflection film may be coated on the substrate W coated with the photoresist. Optionally, the first liquid and the second liquid are the same kind of liquids, and both may be photoresists.

The developing block 300b has the same structure as the coating block 300a, and the liquid processing chamber provided to the developing block 300b supplies a developer onto the substrate.

The interface module 500 connects the processing module 300 with an external exposure apparatus 700. The interface module 500 has an interface frame 510, an additional process chamber 520, an interface buffer 530, and an interface robot 550.

A fan filter unit may be provided at the upper end of the interface frame 510 to form a descending atmosphere therein. The additional process chamber 520, the interface buffer 530, and the interface robot 550 are disposed inside the interface frame 510. The additional process chamber 520 may perform a predetermined additional process before the substrate W of which the process is completed in the coating block 300a is carried into the exposure apparatus 700. Optionally, the additional process chamber 520 may perform a predetermined additional process before the substrate W of which the process is completed in the exposure apparatus 700 is carried into the developing block 300b. According to the exemplary embodiment, the additional process may be an edge exposure process for exposing the edge region of the substrate W, an upper surface cleaning process for cleaning the upper surface of the substrate W, or a lower surface cleaning process for cleaning the lower surface of the substrate W. A plurality of additional process chambers 520 is provided and may be provided to be stacked with each other. All of the additional process chambers 520 may be provided to perform the same process. Optionally, some of the additional process chambers 520 may be provided to perform different processes.

The interface buffer 530 provides a space in which the substrate W to be conveyed between the coating block 300a, the additional process chamber 520, the exposure apparatus 700, and the developing block 300b temporarily stays during the conveying. A plurality of interface buffers 530 is provided, and the plurality of interface buffers 530 may be provided to be stacked with each other.

According to the exemplary embodiment, based on an extension in the longitudinal direction of the conveying chamber 350, the additional process chamber 520 may be disposed on one side surface, and the interface buffer 530 may be disposed on the other side surface.

The interface robot 550 conveys the substrate W between the coating block 300a, the additional process chamber 520, the exposure apparatus 700, and the developing block 300b. The interface robot 550 may have a conveying hand that conveys the substrate W. The interface robot 550 may be provided with one or a plurality of robots. According to the exemplary embodiment, The interface robot 550 has a first robot 552 and a second robot 554. The first robot 552 conveys the substrate W between the coating block 300a, the addition process chamber 520, and the interface buffer 530, the second robot 554 conveys the substrate W between the interface buffer 530 and the exposure apparatus 700, and a second robot 4604 may be provided to convey the substrate W between the interface buffer 530 and the developing block 300b.

Each of the first robot 552 and the second robot 554 includes a hand on which the substrate W is placed, and the hand may be provided to move forward and backward, rotate on an axis of the third direction 16, and be movable along the third direction 16.

Hereinafter, the structure of the liquid processing chamber will be described in detail. Hereinafter, the liquid processing chamber provided in the coating block will be described as an example. Further, the liquid processing chamber will be described with a chamber for coating a photoresist on the substrate W as an example. However, the liquid processing chamber may be a chamber that forms a film such as a protective film or an anti-reflection film on the substrate W. Further, the liquid processing chamber may be a chamber that supplies a developer to the substrate W to develop the substrate W.

Figure 7:
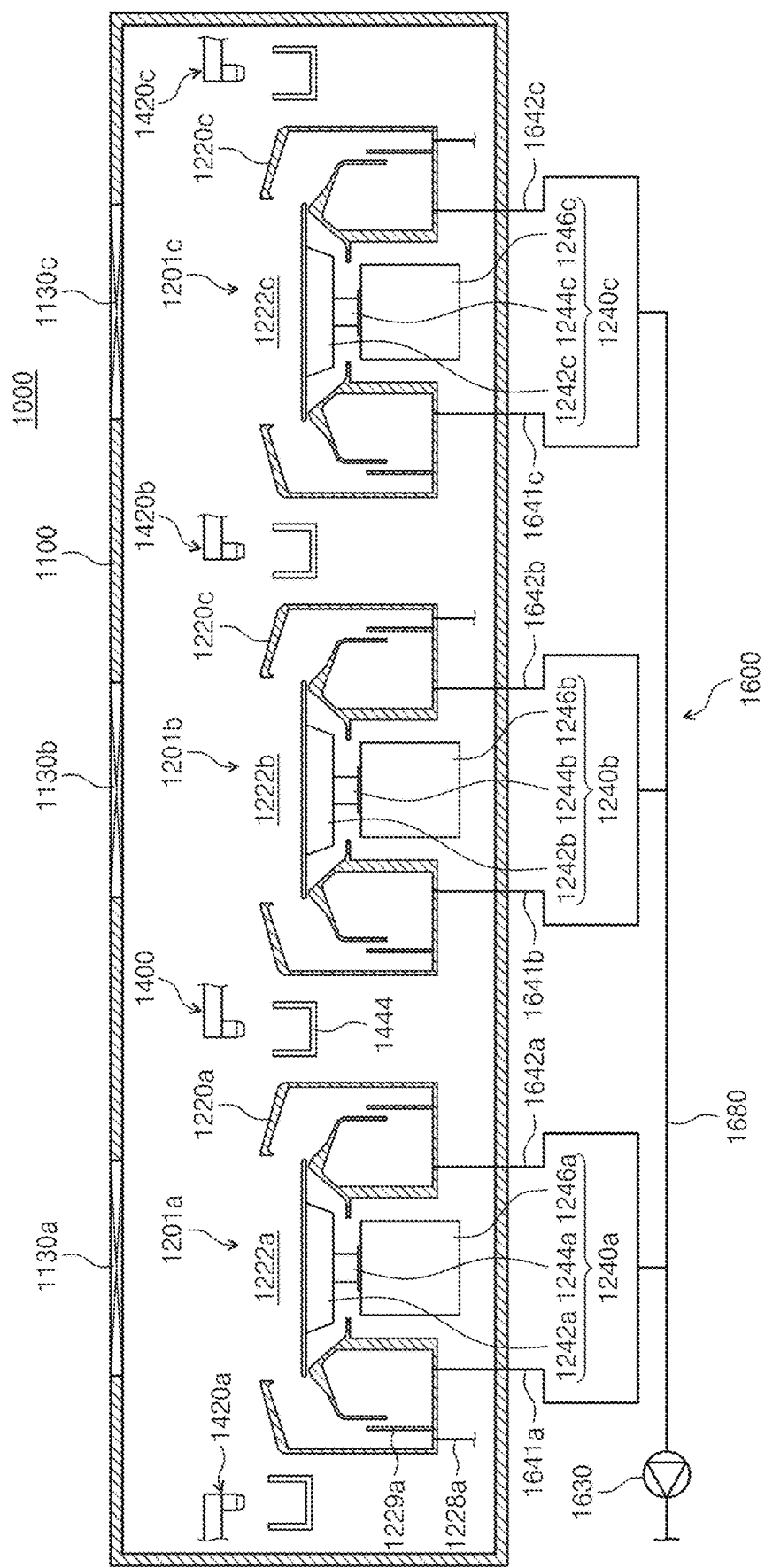
FIG. 7 is a diagram schematically illustrating an example of a liquid processing chamber in the substrate processing apparatus of FIG. 1.
Figure 8:
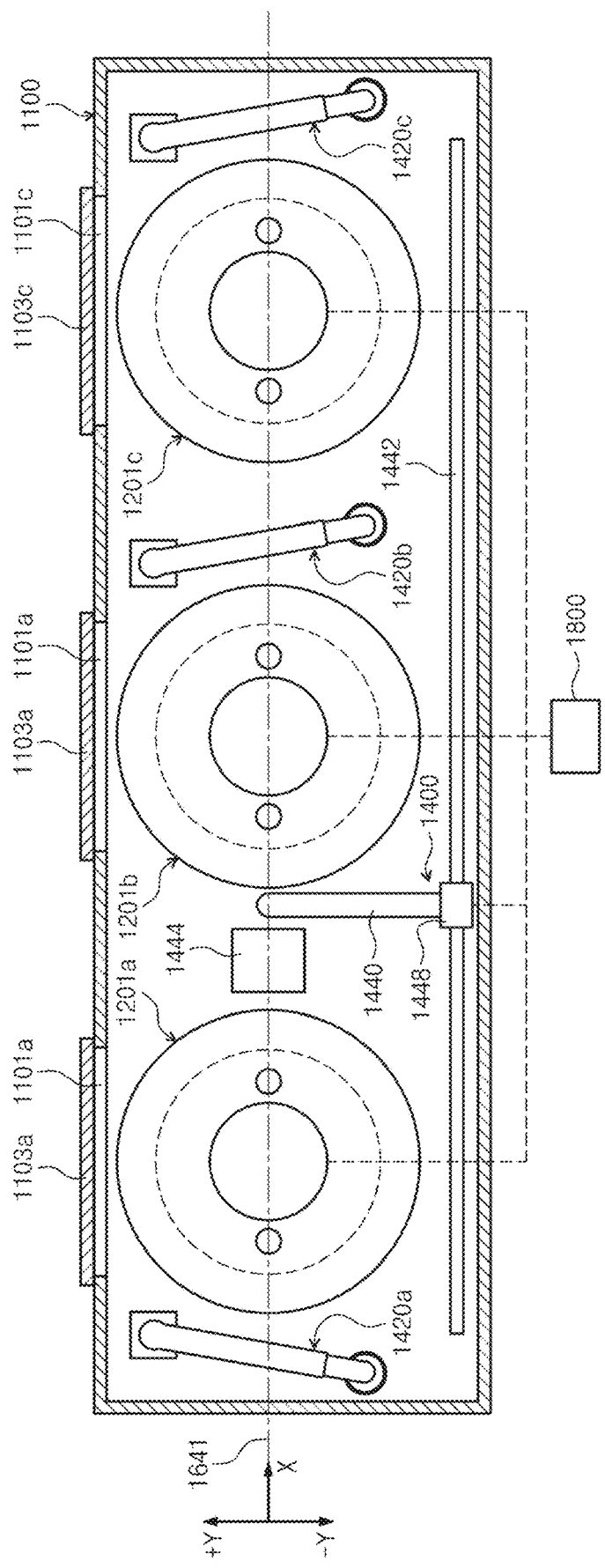
FIG. 8 is a plan view of the liquid processing chamber of FIG. 7.

FIG. 7 is a cross-sectional view illustrating an example of the liquid processing chamber for liquid-processing the substrate W by supplying the processing liquid to the substrate W and FIG. 8 is a plan view of the liquid processing chamber of FIG. 7.

Referring to FIGS. 7 and 8, a liquid processing chamber 1000 includes a housing 1100, a first processing unit 1201a, a second processing unit 1201b, a third processing unit 1201c, a liquid supply unit 1400, an exhaust unit 1600, and a controller 1800.

The housing 1100 is provided in a rectangular cylindrical shape having an inner space. Openings 1101a, 1101b, and 1101c are formed in one side of the housing 1100. The openings 1101a, 1101b, and 1101c function as passages through which the substrate W is carried in or out. The openings 1103a, 1103b, and 1103c are provided with doors 1103a, 1103b, and 1103c, and the doors 1103a, 1103b, and 1103c open and close the openings 1101a, 1101b, and 1101c.

On the upper wall of the housing 1100, fan filter units 1130a, 1130b, and 1130c for supplying a descending atmosphere to the inner space are disposed. The fan filter units 1130a, 1130b, and 1130c have fans for introducing external atmosphere into the inner space and filters for filtering the external atmosphere. The fan filter units 1130a, 1130b, and 1130c are disposed on the first processing container 1220a, the second processing container 1220b, and the third processing container 1220c, respectively.

In the inner space of the housing 1100, the first processing unit 1201a, the second processing unit 1201b, and the third processing unit 1201c are provided. The first processing unit 1201a, the second processing unit 1201b, and the third processing unit 1201c are arranged along one direction. Hereinafter, a direction in which the first processing unit 1201a, the second processing unit 1201b, and the third processing unit 1201c are arranged is referred to as a unit arrangement direction, and illustrated as an X-axial direction in FIG. 8.

The first processing unit 1201a has the first processing container 1220a and a first support unit 1240a.

The first processing container 1220a has a first inner space 1222a. The first inner space 1222a is provided so that the upper portion thereof is opened.

The first support unit 1240a supports the substrate W in the first inner space 1222a of the first processing container 1220a. The first support unit 1240a has a first support plate 1242a, a first driving shaft 1244a, and a first driver 1246a. The first support plate 1242a is provided with a circular upper surface thereof. The first support plate 1242a has a diameter smaller than the substrate W. The first support plate 1242a is provided to support the substrate W by vacuum pressure. Optionally, the first support plate 1242a may have a mechanical clamping structure for supporting the substrate W. The first driving shaft 1244a is coupled to the center of the lower surface of the first support plate 1242a, and the first driver 1246a for providing a rotational force to the first driving shaft 1244a is provided in the first driving shaft 1244a. The first driver 1246a may be a motor.

The second processing unit 1201b has the second processing container 1220b and a second support unit 1240b, and the second support unit 1240b has a second support plate 1242b, a second driving shaft 1244b, and a second driver 1246b. The second processing container 1220b and the second support unit 1240b have substantially the same structure as the first processing container 1220a and the first support unit 1240a.

The third processing unit 1201c has the third processing container 1220c and a third support unit 1240c, and the third support unit 1240c has a third support plate 1242c, a third driving shaft 1244c, and a third driver 1246c. The third processing container 1220c and the third support unit 1240c have substantially the same structure as the first processing container 1220a and the first support unit 1240a.

The liquid supply unit 1400 supplies a liquid onto the substrate W. The liquid supply unit 1400 includes a first nozzle 1420a, a second nozzle 1420b, a third nozzle 1420c, and a processing liquid nozzle 1440. The first nozzle 1420a supplies the liquid to the substrate W provided to the first support unit 1240a, and the second nozzle 1420b supplies the liquid to the substrate W supplied to the second support unit 1240b. The third nozzle 1420c supplies the liquid to the substrate W provided to the third support unit 1240c. The first nozzle 1420a, the second nozzle 1420b, and the third nozzle 1420c may be provided to supply the same type of liquid. According to the exemplary embodiment, the first nozzle 1420a, the second nozzle 1420b, and the third nozzle 1420c may supply a rinse liquid for cleaning the substrate W. For example, the rinse liquid may be water. According to another exemplary embodiment, the first nozzle 1420a, the second nozzle 1420b, and the third nozzle 1420c may supply a removal liquid for removing the photoresist from the edge region of the substrate W. For example, the removal liquid may be a thinner The first nozzle 1420a, the second nozzle 1420b, and the third nozzle 1420c may be rotated between a process position and a standby position based on a rotational shaft thereof, respectively. The process position is a position of ejecting the liquid on the substrate W, and the standby position is a position where the first nozzle 1420a, the second nozzle 1420b and the third nozzle 1420c stand by without ejection of the liquid on the substrate W.

The processing liquid nozzle 1440 supplies the processing liquid to the substrate W provided to the first support unit 1240*a* and the substrate W provided to the second support unit 1240*b*. The processing liquid may be a photoresist. The nozzle driver 1448 drives the processing liquid nozzle 1440 so that the processing liquid nozzle 1440 is moved along the guide 1442 to a first process position, a second process position, a third process position, and a standby position. The first process position is a position to supply the processing liquid to the substrate W supported by the first support unit 1240*a*, the second process position is a position to supply the processing liquid to the substrate W supported by the second support unit 1240*b*, and the third process position is a position to supply the processing liquid to the substrate W supported by the third support unit 1240*c*. The standby position is a position to stand by at a standby port 1444 located between the first processing unit 1201*a* and the second processing unit 1201*b* when the photoresist is not ejected from the processing liquid nozzle 1440.

A gas-liquid separator 1229*a* may be provided in the inner space 1201*a* of the first processing container 1220*a*. The gas-liquid separator 1229*a* may be provided to extend to the upper portion from the bottom wall of the first processing container 1220*a*. The gas-liquid separator 1229*a* may be provided in a ring shape.

According to the exemplary embodiment, the outer side of the gas-liquid separator 1229*a* is provided as a discharge space for discharging the liquid, and the inner side of the gas-liquid separator 1229*a* may be provided as an exhaust space for exhausting the atmosphere. A discharge pipe 1228*a* for discharging the processing liquid is connected to the bottom wall of the first processing container 1220*a*. The discharge pipe 1228*a* discharges the processing liquid flowing between the side wall of the first processing container 1220*a* and the gas-liquid separator 1229*a* to the outside of the first processing container 1220*a*. The atmosphere flowing to a space between the side wall of the first processing container 1220*a* and the gas-liquid separator 1229*a* is introduced into the inner side of the gas-liquid separator 1229*a*. In this process, the processing liquid contained in the atmosphere is discharged to the outside of the first processing vessel 1220*a* through the discharge pipe 1228*a* in the discharge space, and the atmosphere flow is introduced into the exhaust space of the first processing vessel 1220*a*.

Although not illustrated, a lifting driver for adjusting a relative height of the first support plate 1242*a* and the first processing container 1220*a* may be provided.

Figure 9:
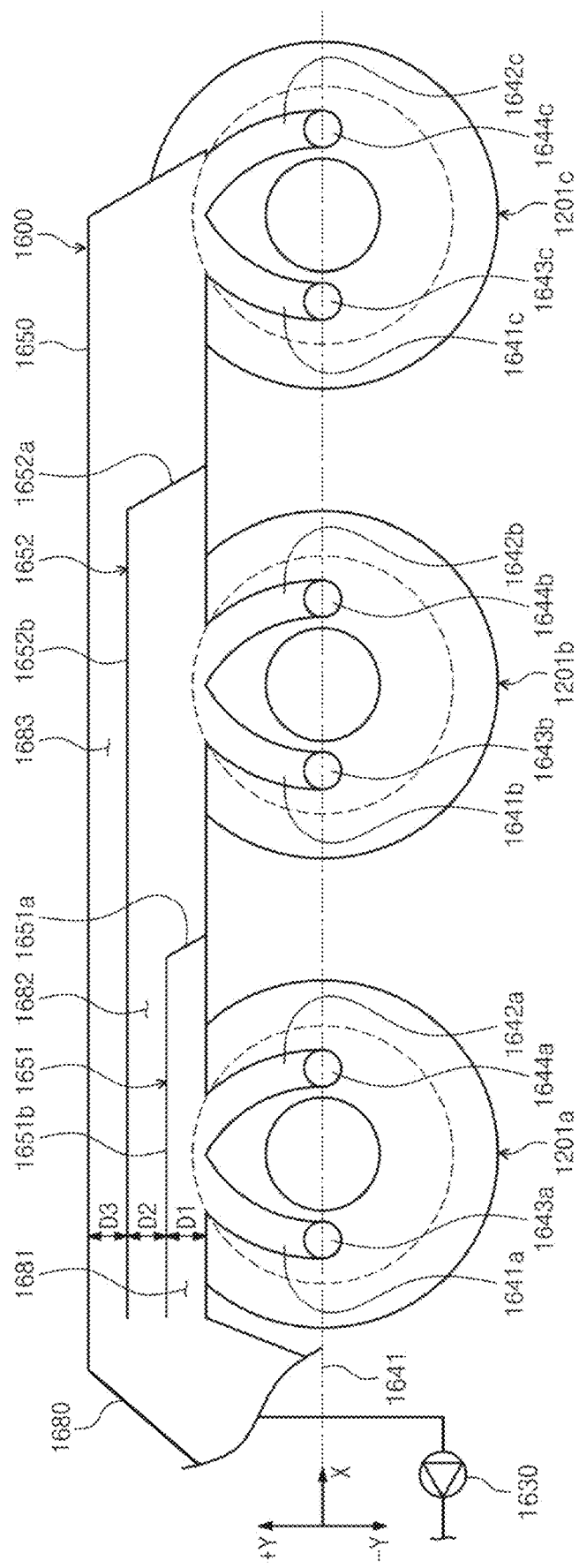
FIG. 9 is a diagram schematically illustrating an exhaust unit of the liquid processing chamber of FIG. 7.

FIG. 9 is a plan view schematically illustrating an example of the exhaust unit 1600. Referring to FIG. 9, the exhaust unit 1600 includes an integrated duct 1680, a first exhaust pipe 1641*a*, a second exhaust pipe 1642*a*, a third exhaust pipe 1641*b*, a fourth exhaust pipe 1642*b*, a fifth exhaust pipe 1641*c*, and a sixth exhaust pipe 1642*c*.

The integrated duct 1680 is disposed on one side based on the unit arrangement direction. In FIG. 9, when the unit arrangement direction is an X axis, the integrated duct 1680 may be positioned in a +Y axial direction based on the unit arrangement direction. The integrated duct 1680 may be disposed so that the longitudinal direction thereof is substantially parallel with the unit arrangement direction.

The first exhaust pipe 1641*a* and the second exhaust pipe 1642*a* are coupled to the first processing container 1220*a* to exhaust the atmosphere from the first inner space 1222*a* of the first processing container 1220*a*. The first exhaust pipe 1641*a* is connected with a first exhaust port 1643*a* for introducing the atmosphere of the first inner space 1222*a*, and the second exhaust pipe 1642*a* is connected with a second exhaust port 1644*a* for introducing the atmosphere of the first inner space 1222*a*. According to the exemplary embodiment, the first exhaust pipe 1641*a* and the second exhaust pipe 1642*a* may be coupled to the bottom wall of the first processing container 1220*a*.

The third exhaust pipe 1641*a* and the fourth exhaust pipe 1642*a* are coupled to the second processing container 1220*b* to exhaust the atmosphere from the second inner space 1222*b* of the second processing container 1220*b*. The third exhaust pipe 1641*a* is connected with a third exhaust port 1643*b* for introducing the atmosphere of the second inner space 1222*b*, and the fourth exhaust pipe 1642*b* is connected with a fourth exhaust port 1644*b* for introducing the atmosphere of the second inner space 1222*b*. According to the exemplary embodiment, the third exhaust pipe 1641*a* and the fourth exhaust pipe 1642*a* may be coupled to the bottom wall of the second processing container 1220*b*.

The fifth exhaust pipe 1641*c* and the sixth exhaust pipe 1642*c* are coupled to the third processing container 1220*c* to exhaust the atmosphere from the third inner space 1222*c* of the third processing container 1220*c*. The fifth exhaust pipe 1641*c* is connected with a fifth exhaust port 1643*c* for introducing the atmosphere of the third inner space 1222*c*, and the sixth exhaust pipe 1642*c* is connected with a sixth exhaust port 1644*c* for introducing the atmosphere of the third inner space 1222*c*. According to the exemplary embodiment, the fifth exhaust pipe 1641*c* and the sixth exhaust pipe 1642*c* may be coupled to the bottom wall of the third processing container 1220*c*.

The first exhaust pipe 1641*a* may have a main pipe and an inlet. The first exhaust port 1643*a* is provided at one end of the inlet, and the main pipe may be provided to extend from the other end of the inlet. The inlet is provided perpendicular to the bottom wall of the first processing container 1220*a*, and the main pipe may be substantially parallel to the bottom wall of the first processing container 1220*a*. The inlet may be provided so that the length is relatively shorter than that of the main pipe. The first exhaust port 1643*a* may be provided at a position spaced apart upward from the bottom wall of the first processing container 1220*a*. Optionally, the first exhaust port 1643*a* may be at the same height as the bottom wall of the first processing container 1220*a*. Optionally, the first exhaust port 1643*a* is provided at the same height as the bottom wall of the first processing container 1220*a*, and simultaneously, the first exhaust pipe 1641*a* may have only the main pipe without the inlet. In this case, the first exhaust pipe 1641*a* is in contact with the bottom wall of the first processing container 1220*a*, and the first exhaust port 1643*a* may be formed on the first exhaust pipe 1641*a*. The second exhaust pipe 1642*a*, the third exhaust pipe 1641*b*, the fourth exhaust pipe 1642*b*, the fifth exhaust pipe 1641*c*, and the sixth exhaust pipe 1642*c* may be provided in the same shape and structure as the first exhaust pipe 1641*a*.

In the aforementioned example, a virtual straight line 1641 for connecting the third exhaust port 1643*b* and the fourth exhausting port 1643*b* and the fifth exhaust port 1643*c* and the sixth exhaust port 1644*c* may be the same straight line as the virtual straight line 1641 for connecting the first exhaust port 1643*a* and the second exhaust port 1644*a*. For example, the first exhaust port 1643*a*, the second exhaust port 1644*a*, the third exhaust 1643*b*, the fourth exhaust port 1644*b*, the fifth exhaust port 1643*c*, and the sixth exhaust port 1644*c* may be disposed sequentially along the above virtual straight line 1641.

In the integrated duct 1680, a decompression member 1630 for providing flow pressure for exhausting may be provided. For example, the decompression member 1630 may be a pump or a fan. The integrated duct 1680 includes a first wall member 1651, a second wall member 1652 and an outer wall member 1650. When it is defined as the outside toward a (+Y)-axial direction, the second wall member 1652 is positioned outside the first wall member 1651, and the outer wall member 1650 is positioned outside the second wall member 1652. The first wall member 1651 has a first part 1651*a* and a second part 1651*b*. The first part 1651*a* is in contact with the inner wall of the integrated duct 1680 and is disposed inclined with respect to a longitudinal direction of the integrated duct 1680, and the second part 1651*b* extends from the first part 1651*a* and is disposed parallel to the longitudinal direction of the integrated duct 1680.

The first wall member 1651 starts between the first processing unit 1201*a* and the second processing unit 1201*b* to extend along the exhaust direction. More specifically, the first wall member 1651 starts between a first position where the first exhaust pipe 1641*a* and the second exhaust pipe 1642*a* are connected to the integrated duct 1680 and a second position where the third exhaust pipe 1641*b* and the fourth exhaust pipe 1642*b* are connected to the integrated duct 1680 to extend along the exhaust direction and partitions an exhaust path of the integrated duct 1680. The second wall member 1652 starts between the second processing unit 1201*b* and the third processing unit 1201*c* to extend along the exhaust direction. More specifically, the second wall member 1652 starts between the second position where the third exhaust pipe 1641*b* and the fourth exhaust pipe 1642*b* are connected to the integrated duct 1680 and a third position where the fifth exhaust pipe 1641*c* and the sixth exhaust pipe 1642*c* are connected to the integrated duct 1680 to extend along the exhaust direction and partitions an exhaust path of the integrated duct 1680.

The first wall member 1651 forms a first exhaust path 1681 in the relationship with the integrated duct 1680. The second wall member 1652 forms a second exhaust path 1682 in the relationship with the first wall member 1651. The outer wall member 1650 forms a third exhaust path 1683 in the relationship with the second wall member 1652. The extending lengths of the first wall member 1651 and the second wall member 1652 may be provided to be different from each other. The first wall member 1651 and the second wall member 1652 may extend to a first point. The first point is a front side in an X-axial direction of a point where the first exhaust pipe 1641*a* and the integrated duct 1680 are connected and a downstream of the point where the first exhaust pipe 1641*a* and the integrated duct 1680 are connected according to an exhaust direction.

The first exhaust path 1681 is circularly connected to the first exhaust pipe 1641*a* and the second exhaust pipe 1642*a*. The second exhaust path 1682 is circularly connected to the third exhaust pipe 1641*b* and the fourth exhaust pipe 1642*b*. The third exhaust path 1683 is circularly connected to the fifth exhaust pipe 1641*c* and the sixth exhaust pipe 1642*c*.

The cross-sectional areas of the first exhaust path 1681, the second exhaust path 1682 and the third exhaust path 1683 may be provided the same as each other. In an example, a cross-sectional area D1 of the first exhaust path 1681, a cross-sectional area D2 of the second exhaust path 1682, and a cross-sectional area D3 of the third exhaust path 1683 are provided the same as each other. In the description of the present invention, the expression that the cross-sectional area is the same does not mean mathematically and physically complete same, but includes that the cross-sectional area includes the same and similar ranges on the design in consideration of processing errors. Further, the cross-sectional areas of the first exhaust path 1681, the second exhaust path 1682 and the third exhaust path 1683 may be provided to be different from each other. However, based on an experimental result of exhaust amounts exhausted from the first exhaust path 1681, the second exhaust path 1682 and the third exhaust path 1683, the cross-sectional area D1 of the first exhaust path 1681, the cross-sectional area D2 of the second exhaust path 1682, and the cross-sectional area D3 of the third exhaust path 1683 are designed so that each exhaust amount is the same.

The first wall member 1651 and the second wall member 1652 serve to guide the atmosphere in the integrated duct 1680. In the first wall member 1651 and the second wall member 1652, depending on the process conditions, the length and the width of the partition wall may be selectively configured. The first wall member 1651 and the second wall member 1652 are installed in the integrated duct 1680 to uniformize the wind velocity and the exhaust pressure provided to each of the first processing unit 1201*a*, the second processing unit 1201*b*, and the third processing unit 1201*c* while preventing the interference of the atmosphere exhausted from each of the first processing unit 1201*a*, the second processing unit 1201*b*, and the third processing unit 1201*c*.

Optionally, the first wall member 1651 and the second wall member 1652 may be provided so that the position is movable. The first wall member 1651 and the second wall member 1652 may be provided to be independently movable. The driver may be connected to each of the first wall member 1651 and the second wall member 1652 to control the first wall member 1651 and the second wall member 1652 to be moved. The first wall member 1651 and the second wall member 1652 are controlled to be moved in a +Y direction or −Y direction to vary the cross-sectional area D1 of the first exhaust path 1681, the cross-sectional area D2 of the second exhaust path 1682, and the cross-sectional area D3 of the third exhaust path 1683, thereby uniformizing the exhaust amount. For example, according to the process conditions, the rotational speed of each of the support units 1240*s*, 1240*b*, and 1240*c* may be varied. In this case, the first wall member 1651 and the second wall member 1652 are controlled to be moved in a +Y direction or −Y direction to vary the cross-sectional area D1 of the first exhaust path 1681, the cross-sectional area D2 of the second exhaust path 1682, and the cross-sectional area D3 of the third exhaust path 1683, thereby uniformizing the exhaust amount.

Figure 10:
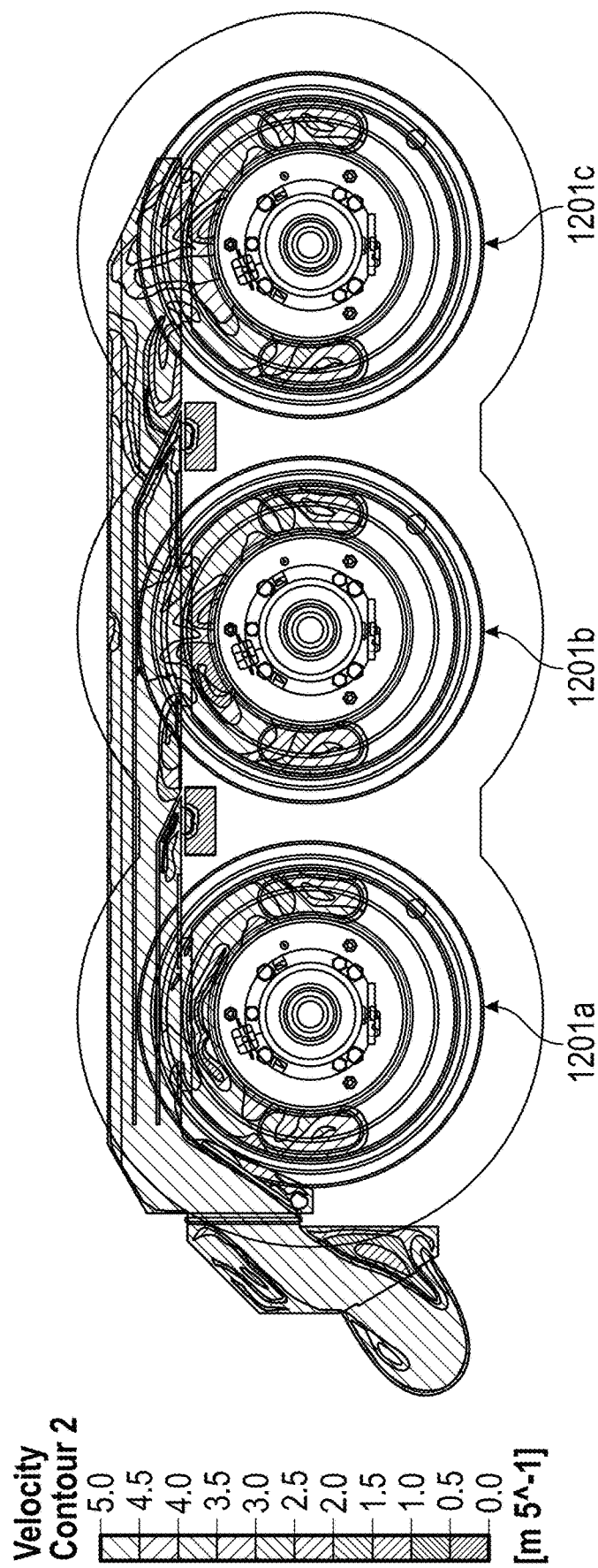
FIG. 10 is a diagram illustrating the flow of atmosphere when processing the substrate in the liquid processing chamber of FIG. 7.
Figure 11:
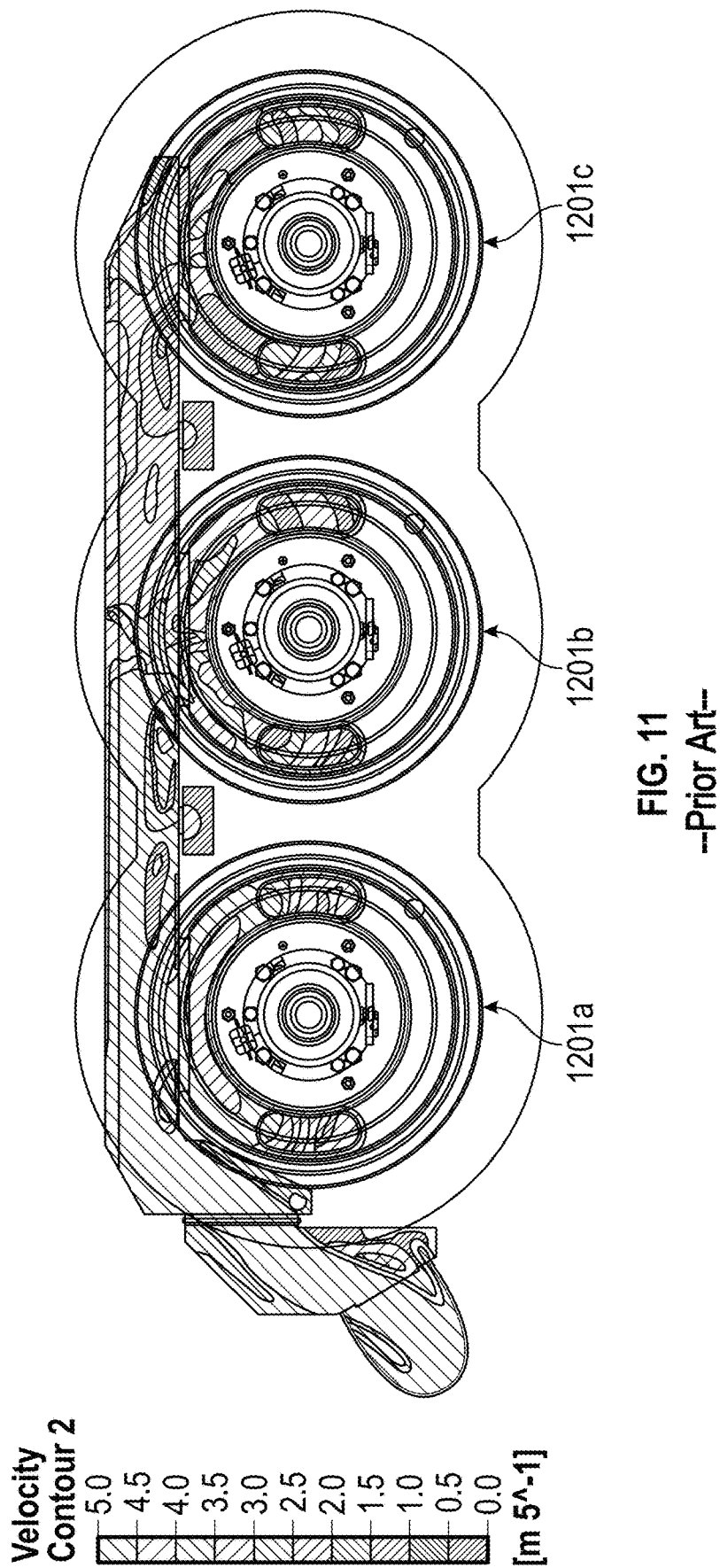
FIG. 11 is a diagram illustrating the flow of atmosphere by an exhaust unit of Comparative Example compared with the present invention.
Figure 12:
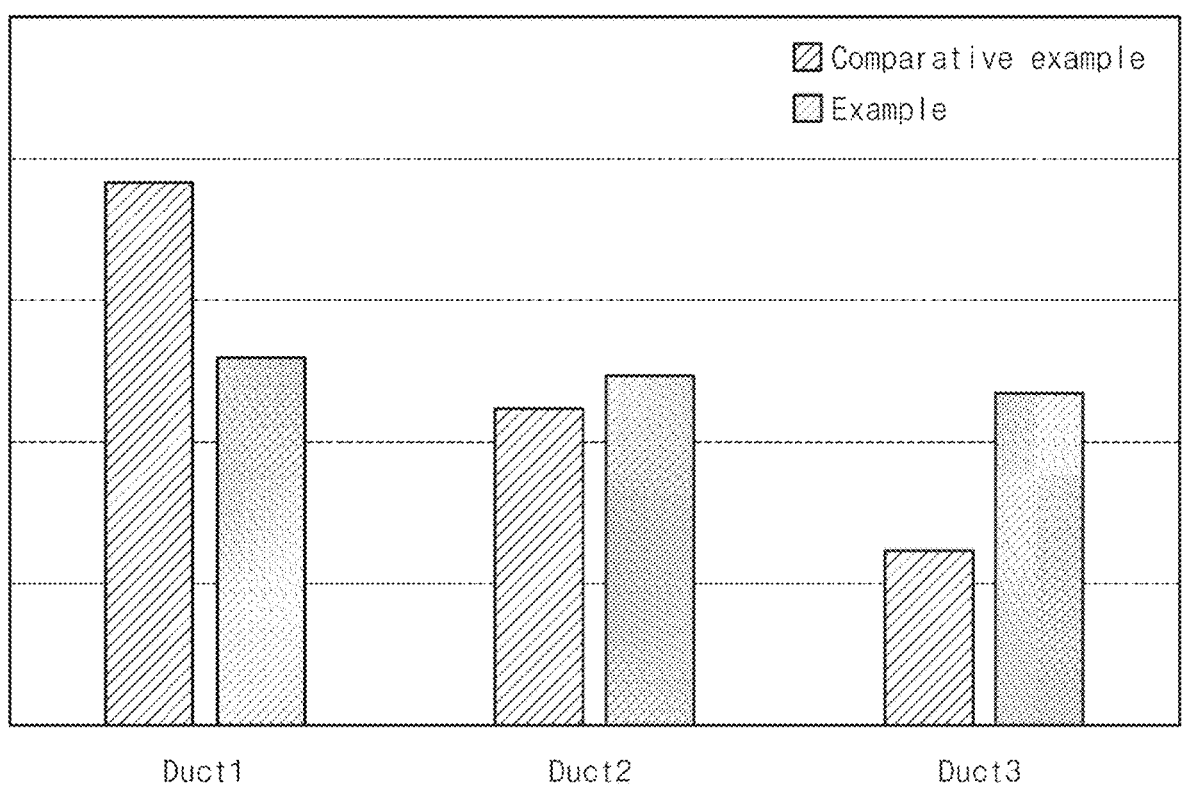
FIG. 12 is a graph of comparing an exhaust amount for each position of an exhaust duct when processing the substrate in the liquid processing chamber of FIG. 7 with Comparative Example of FIG. 11.

FIG. 10 is a diagram illustrating the flow of atmosphere when processing the substrate in the liquid processing chamber of FIG. 7. Referring to FIG. 10, according to the exemplary embodiment of the present invention, the wind velocity and the exhaust pressure provided to each of the first processing unit 1201*a*, the second processing unit 1201*b*, and the third processing unit 1201*c* are constant. FIG. 11 is a diagram illustrating the flow of atmosphere by an exhaust unit of Comparative Example compared with the present invention. When describing Comparative Example with reference to FIG. 11, the third processing unit 1201*c* interferes with the atmosphere flow of the first processing unit 1201*a* and the second processing unit 1201*b* to have the lowest wind velocity and exhaust pressure. The first processing unit 1201*a* is positioned so as not to be affected by the atmosphere of the second processing unit 1201*b* and the third processing unit 1201*c* and is close to an exhaust air conditioning connection unit to have high wind velocity and exhaust pressure. That is, in Comparative Example, it is difficult to maintain and manage equally the wind velocitys and the exhaust pressures of the first processing unit 1201*a*, the second processing unit 1201b and the third processing unit 1201c in terms of the equipment process performance FIG. 12 is a graph of comparing an exhaust amount for each position of an exhaust duct when processing the substrate in the liquid processing chamber of FIG. 7 with Comparative Example of FIG. 11. Referring to FIG. 12, an exhaust pipe duct1 corresponding to the first processing unit 1201a, an exhaust pipe duct2 corresponding to the second processing unit 1201b, and an exhaust pipe duct3 corresponding to the third processing unit 1201c have a large difference in exhaust amount in the case of Comparative Example, but are almost the same as each other in the exhaust amount in Example.

The controller 1800 controls the first processing unit 1201a, the second processing unit 1201b, the third processing unit 1201c, and the liquid supply unit 1400. When a first substrate W is placed on the first support unit 1240a, the processing liquid nozzle 1440 is moved to the first process position. The controller 1800 controls the first support unit 1240a so that the first substrate W is rotated, and controls the liquid supply unit 1400 so that the photoresist is ejected to the first substrate W placed on the first support unit 1240a from the processing liquid nozzle 1440. Thereafter, when a second substrate W is placed on the second support unit 1240b, the processing liquid nozzle 1440 is moved to the second process position. The controller 1800 controls the second support unit 1240b so that the second substrate W is rotated, and controls the liquid supply unit 1400 so that the photoresist is ejected to the second substrate W placed on the second support unit 1240b from the processing liquid nozzle 1440. Thereafter, when a third substrate W is placed on the third support unit 1240c, the processing liquid nozzle 1440 is moved to the third process position. The controller 1800 controls the third support unit 1240c so that the third substrate W is rotated, and controls the liquid supply unit 1400 so that the photoresist is ejected to the third substrate W placed on the third support unit 1240c from the processing liquid nozzle 1440.

The processing liquid nozzle 1440 may eject the photoresist in any one of the first processing unit 1201a, the second processing unit 1201b, and the third processing unit 1201c, while in other one or more processing units, the rinse liquid or the removal liquid may be ejected from the first nozzle 1420a, the second nozzle 1420b or the third nozzle 1420c.

The exhausting is performed in the inner spaces 1222a, 1222b and 122c of the processing units 1201a, 1201b and 1201c while the process is performed in the processing units 1201a, 1201b, and 1201c. When using the apparatus having the exhaust unit of Comparative Example as illustrated in FIG. 11, among the exhaust pipes, the exhaust pipe closer to the decompression member has higher exhaust pressure and the exhaust pipe farther from the decompression member has lower exhaust pressure, and as a result, ununiformity of the exhaust pressure occurs. However, when using the apparatus having the exhaust unit 1600 like Example of the present invention, as illustrated in FIG. 11, the exhaust pressure of each of the processing units 1201a, 1201b, and 1201c may be equally distributed, thereby securing the same process result in each of the processing units 1201a, 1201b, and 1201c.

As described above, the providing of the three processing units 1201 a, 1201 b, and 1201 c has been described as an example, but based on the technical idea of the present invention, the two processing units 1201 a and 1201 b are provided, so that the first wall member 1651 may be provided in the integrated duct 1680. The first wall member 1651 starts between the first processing unit 1201 a and the second processing unit 1201 b to extend along the exhaust direction, partition the exhaust path of the integrated duct 1680, and form the first exhaust path 1681 and the second exhaust path 1682 in the relationship with the integrated duct 1680. The first exhaust path 1681 is circularly connected to the first exhaust pipe 1641 a and the second exhaust pipe 1642 a. The second exhaust path 1682 is circularly connected to the third exhaust pipe 1641 b and the fourth exhaust pipe 1642 b. The cross-sectional areas of the first exhaust path 1681 and the second exhaust path 1682 are equally provided or the cross-sectional area D1 of the first exhaust path 1681 and the cross-sectional area D2 of the second exhaust path 1682 are designed so that each exhaust amount is the same based on the experimental result of the exhaust amounts exhausted from the first exhaust path 1681 and the second exhaust path 1682.

The controller 1800 described above may control the substrate processing apparatus. The controller 1800 may control the components of the substrate processing apparatus 1000 so as to process the substrate according to the setting process as described above. The controller 1800 may include a processor controller consisting of a microprocessor (computer) for executing a control of the substrate processing apparatus, a keyboard for performing a command input operation and the like to manage the substrate processing apparatus by an operator, a user interface consisting of a display and the like for visualizing and displaying an moving situation of the substrate processing apparatus, and a storage unit for storing control programs or various data for executing the processing executed in the substrate processing apparatus by the control of the process controller and programs, that is, processing recipes for executing the processing in each configuration unit according to a processing condition. In addition, the user interface and the storage unit may be connected to the process controller. The processing recipes may be stored in a storage medium in the storage unit, and the storage medium may be a hard disk, and a transportable disk such as a CD-ROM, a DVD, and the like or a semiconductor memory such as a flash memory and the like.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for processing a substrate comprising:
a first processing unit comprising a first processing container configured to have a first inner space and a first support unit, wherein the first support unit supports, and rotates the substrate within the first inner space;
a second processing unit comprising a second processing container configured to have a second inner space and a second support unit, wherein the second support unit supports, and rotates the substrate within the second inner space;

wherein the first processing unit and the second processing unit are arranged in a unit arrangement direction; and an exhaust unit configured to exhaust the first inner space and the second inner space, wherein the exhaust unit comprises:

an integrated duct having a portion positioned in a Y axial direction when the unit arrangement direction is in an X axis, wherein a longitudinal direction of the integrated duct is substantially parallel with the unit arrangement direction;

a first exhaust pipe configured to have a first exhaust port for introducing the atmosphere of the first inner space to the integrated duct and exhaust the atmosphere of the first inner space to the integrated duct; and a second exhaust pipe configured to have a second exhaust port for introducing the atmosphere of the second inner space and exhaust the atmosphere of the second inner space to the integrated duct, wherein the integrated duct comprises a first wall member configured to partition a first exhaust path in the integrated duct, wherein the first wall member starts between a first position where the first exhaust pipe is connected with the integrated duct and a second position where the second exhaust pipe is connected with the integrated duct and, the first wall member extends along an exhaust direction of the first exhaust path, wherein the first wall member partitions a first exhaust path in connection with the first exhaust pipe and a second exhaust path in connection with the second exhaust pipe, wherein the first position is downstream from the second position in the exhaust direction of each of the first exhaust path and the second exhaust path, wherein the atmosphere of the first interior space exhausted through the first exhaust path and the atmosphere of the second interior space exhausted through the second exhaust path join downstream of the first wall member, and wherein the first wall member has a first part and a second part, and wherein the first part is in contact with an inner wall of the integrated duct and is disposed inclined with respect to the longitudinal direction of the integrated duct, and the second part extends from the first part and is disposed parallel to the longitudinal direction of the integrated duct, wherein the second part extends parallel to an outer wall of the exhaust unit in the exhaust direction of the first exhaust path and the second exhaust path.

2. The apparatus for processing the substrate of claim 1, wherein the first wall member extends downstream of the first position according to the exhaust direction of the first position.

3. The apparatus for processing the substrate of claim 2, wherein at the end of the first wall member, the cross-sectional areas of the first exhaust path and the second exhaust path are equally provided.

4. The apparatus for processing the substrate of claim 1, further comprising:

a third processing unit comprising a third processing container configured to have a third inner space and a third support unit, wherein the third support unit supports, rotates, and processes the substrate within the third inner space, wherein the third processing unit is arranged in a line with the first processing unit and the second processing unit, wherein the exhaust unit further comprises a third exhaust pipe configured to further exhaust the third inner space, have a third exhaust port for introducing the atmosphere of the third inner space, and exhaust the atmosphere introduced through the third exhaust port to the integrated duct, wherein the integrated duct further comprises a second wall member configured to partition the second exhaust path in the integrated duct; and wherein the second wall member starts between the second position and a third position where the second exhaust pipe is connected with the integrated duct and extend along the exhaust direction of the second exhaust path, and wherein the second wall member partitions a third exhaust path provided to be in circulation with the second exhaust pipe and the third exhaust pipe.

5. The apparatus for processing the substrate of claim 4, wherein the first wall member and the second wall member extends downstream of the first position according to the exhaust direction of the first position.

6. The apparatus for processing the substrate of claim 5, wherein at the ends of the first wall member and the second wall member, the cross-sectional areas of the first exhaust path, the second exhaust path, and the third exhaust path are equally provided.

7. The apparatus for processing the substrate of claim 1, wherein the first exhaust pipe is coupled to a bottom wall of the first processing container, and wherein the second exhaust pipe is coupled to a bottom wall of the second processing container.

8. The apparatus for processing the substrate of claim 1, further comprising:

a liquid supplier configured to supply a processing liquid onto the substrate supported by the first support unit or the second support unit.

9. The apparatus for processing the substrate of claim 1, wherein a decompression member is provided downstream the first position of the integrated duct, the decompression member being a pump or a fan.

10. The apparatus for processing the substrate of claim 1, further comprising:

a liquid supply unit configured to eject the processing liquid to the substrate, wherein the liquid supply unit comprises nozzles; and a nozzle driver configured to move the nozzles to a first process position facing the first support unit or a second process position facing the second support unit so that the nozzles eject the liquid to a substrate selected from the substrate supported by the first support unit and the substrate supported by the second support unit.

11. The apparatus for processing the substrate of claim 10, wherein the processing liquid is a photoresist.

12. The apparatus for processing the substrate of claim 11, further comprising:

a first fan filter unit located above the first processing unit and configured to include a fan for introducing external air to the first inner space and a filter for filtering the external air; and a second fan filter unit located above the second processing unit and configured to include a fan for introducing external air to the second inner space and a filter for filtering the external air.

13. The apparatus for processing the substrate of claim 1, wherein the first exhaust pipe and the second exhaust pipe are sequentially arranged along the arrangement direction of the first processing unit and the second processing unit.

14. The apparatus for processing the substrate of claim 4, wherein the first exhaust pipe, the second exhaust pipe, and the third exhaust pipe are sequentially arranged along the arrangement direction of the first processing unit, the second processing unit, and the third processing unit.

15. The apparatus for processing the substrate of claim 1, wherein the first wall member is configured to be moved in a +Y direction or a −Y direction to vary the cross-sectional area of the first exhaust path.

16. The apparatus for processing the substrate of claim 1, wherein the first exhaust path is circularly connected to the first exhaust pipe and the second exhaust pipe.

\* \* \* \* \*